(12) United States Patent
Gamand

(10) Patent No.: US 7,973,604 B2
(45) Date of Patent: Jul. 5, 2011

(54) TUNABLE MULTI FREQUENCY BANDS FILTER DEVICE

(75) Inventor: Patrice Gamand, Douvres la Delivrande (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/597,123

(22) PCT Filed: Apr. 24, 2008

(86) PCT No.: PCT/IB2008/051576
§ 371 (c)(1),
(2), (4) Date: Oct. 22, 2009

(87) PCT Pub. No.: WO2008/132668
PCT Pub. Date: Nov. 6, 2008

(65) Prior Publication Data
US 2010/0134205 A1  Jun. 3, 2010

(30) Foreign Application Priority Data

May 1, 2007  (EP) ..................................... 07290548

(51) Int. Cl.
*H03F 3/60* (2006.01)
*H03F 3/191* (2006.01)
(52) U.S. Cl. ........................................ 330/286; 330/305
(58) Field of Classification Search .................. 330/286, 330/295, 303, 305
See application file for complete search history.

(56) References Cited

U.S. PATENT DOCUMENTS

| | | | |
|---|---|---|---|
| 5,349,306 A | 9/1994 | Apel | |
| 6,650,185 B1 | 11/2003 | Stengel et al. | |
| 7,498,883 B2 * | 3/2009 | Wu et al. | 330/286 |
| 7,782,140 B2 * | 8/2010 | Shigematsu | 330/286 |
| 2003/0201830 A1 | 10/2003 | Stengel et al. | |

OTHER PUBLICATIONS

Moez, K. K., et al; "Design of Broadband Bandpass CMOS Amplifiers Based on Modified Distributed Amplification Technique"; Circuits and Systems, 2005, 48TH Midwest Symposium on Cinicinnato, OH, US; Aug. 7, 2005; p. 794-797; IEEE; XP010893708; ISBN 978-0-7803-9197-0.

Mehta, N.P., et al; "Disign Guidelines for a Novel Bandpass Distributed Amplifier"; 2005 European Microwae Conference CNIT La Defencse, Paris, FR; Oct. 4-6, 2005; IEEE; Piscataway, NJ, US; vol. 1; pp. 317-320; XP010903619; ISBN: 978-2-9600551-2-2.

Balamurugan, S., et al; "A Novel Electronically Tunable Active Deplexer for Wireless Transceiver Applications"; 2005 European Microwave Conference CNIT La Defense, Paris, France; Oct. 4-6, 2005; IEEE, Piscataway, NJ, US; vol. 3; Oct. 4, 2005; p. 1767-1770; XP010904279; ISBN: 978-2-9600551-2-2.

* cited by examiner

*Primary Examiner* — Steven J Mottola

(57) ABSTRACT

The present invention relates to a tunable filter device for providing a tunable band pass characteristics for the receive path of a multi-band front-end module. According to the invention is proposed, a distributed, wide-band amplifier with a low-frequency cut-off and a high-frequency cut-off in combination with a LCR network, of which wide-band amplifier the DC blocking capacitors define the low-frequency cut-off of the filter device, whilst the high-frequency cut-off is determined by the cut-off frequency of the artificial input and output transmission lines of the LCR network. In one embodiment, additional capacitors are coupled in parallel to the DC blocking capacitors of the LCR network, switchable by MOS transistors as switching elements. Accordingly, in a certain embodiment it is proposed to allow tuning of the low- and the high-frequency cut-off by programming with a digital control command.

10 Claims, 4 Drawing Sheets

US 7,973,604 B2

TUNABLE MULTI FREQUENCY BANDS FILTER DEVICE

FIELD OF THE INVENTION

The present invention relates to a filter device tunable for multi frequency bands, a method for tuning a respective filter device, and a telecommunication device arranged for receiving multi frequency bands comprising a multi-band front end module with a receive path employing such a tunable filter device.

The field of the invention is in particular related to the RF communications where information is transmitted and received in several frequency bands with respective bandwidths, in accordance to the different standards used. For instance, a single system, such as a mobile phone, should be able to do so. In such system, there are needed as many RF band filters as frequency bands or standards.

BACKGROUND OF THE INVENTION

FIG. 1 illustrates a simplified example of a RF communication device 100 with multi-band RF communication pipes. The device 100 comprises a mobile communication section with a sending branch 130 and a receiving branch 140, for enabling communication according to certain standards of present mobile communications systems, adapted, for example, to 2G (second generation) technology as GSM (Global System for Mobile Communications) or EDGE (Enhanced Data rates for GSM Evolution), 3G (third-generation) technology as WCDMA (Wideband Code Division Multiple Access) or UMTS (Universal Mobile Telecommunications System), or WLAN (wireless local area network) technology, just to name some present well known technologies.

For that purpose the device 100 comprises a set of antennas 121, 122 connected a signal switch 110. Receiving signals from the antennas 121, 122 are supplied to the receiving section 140, which comprises a filter bank 141 with several RF bandpass filters 1, 2, 3, 4, 5 each frequency pass characteristics fixedly configured for pass through of a specific frequency band as required by the respective mobile communications standard to be received. After the respectively used filter, the filtered receiving signal is forwarded to a RF receiving signal processing section 142 for processing of the receiving signal, e. g. down mixing, demodulation, decoding inter alia, such that information carried by the receiving signal can be provided to a base band section 160 of the device 100 for further and designated use thereof.

In the sending branch 130 are a respective RF sending signal processing section 132 for processing from a base band signal provided from the base band section 160, e.g. be encoding, modulating, up-mixing and so on. After the RF sending signal processing section 132, there is a sending power stage 131 with respective power amplifiers and sending filters. From the sending power stage 131 the sending signals are supplied to the antennas 121, 122 via the signal switch 110 for transmission.

The RF communication device 100 with multi-band RF communication pipes of FIG. 1 further comprises a receiving branch for additional telecommunication broadcastings services becoming more and more available such as TvoM (TV on Mobile) or DVB-T (Digital Video Broadcasting-Terrestrial), which are transmitted in respective frequency bands such as VHF-band, UHF-band, or L-band.

Accordingly, there the device 100 comprises respective configured antennas 123, 124, 125 which designated to a respective RF receiving circuits 151, 152, 153 from which a respective receiving signal is supplied again to respective adapted bandpass filters 6, 7, 8, where each frequency pass characteristics again is fixedly configured for pass through of a specific frequency band. The filtered receiving signal is forwarded to a respective configured RF receiving signal processing section 152, where the receiving signal is processed in order to provide the desired telecommunication signal to the base band section for designated use thereof.

In the example of FIG. 1, at least a total of 8 individual RF bandpass filters 1, 2, 3, . . . , 7, 8 are employed and needed. Accordingly, the conventional approach of FIG. 1 has drawbacks as being costly because each RF bandpass filters 1, 2, 3, . . . , 7, 8 is a stand-alone device. Further, each filter device is not optimized for miniaturization. Furthermore, the filter devices are lossy which makes challenging the respective technical specifications.

A promising approach is application of a so-called a distributed amplifier (DA), a diagram illustrating the function principle is shown in FIG. 2. Accordingly, a DA 200 consists of a pair of transmission lines, namely an input transmission line 210 and an output transmission line 220 both assumed to have a characteristic impedance of $Z_0$. The transmission lines 210, 220 connect independently the inputs and outputs of several active elements T1 to TN, depicted as transistors. When an signal is supplied to the input transmission line 210 connected via the input In of the first active element T1, as the input signal propagates down the input transmission line 210, the individual active elements T1 to TN respond to the forward traveling input signal step by step, thereby inducing an amplified complementary forward traveling output signal on the output transmission line 220. Assumed the delays of the input line sections $S_{in}$ and output line sections $S_{out}$ are made equal by appropriate selection of propagation constants and lengths, the output signals from each individual active element T1 to TN are such as to sum in phase. Respective terminating resistors $Z_g$ and $Z_d$ are used to minimize destructive reflections. The transconductive gain of each element T1 to TN is assumed to be $G_m$ and the output impedance seen by each of the active elements T1 to TN is half the characteristic impedance of the respective transmission line 210 or 220. Hence, the overall voltage gain of the DA 200 can be determined by formula (1).

$$G = N \cdot G_m \cdot \frac{Z_0}{2}, \quad (1)$$

where N denotes the number of amplifying stages comprising the active elements T1, T2, T3, T4. If losses may be neglected, the gain of the DA 200 has a linear dependence on the number of amplifying stages. Unlike the multiplicative nature of a cascade of conventional amplifiers, the DA 200 has an additive effect. Hence, the architecture of the DA 200 achieves a synergistic property that provides gain at frequencies beyond that of the unity-gain frequency of the individual stages.

U.S. Pat. No. 6,650,185 shows an application of the distributed amplifier technology in connection with FIG. 2, where the circuit design is such to have a frequency selective amplifier. The disclosed selective amplifier consists of a plurality of amplifier stages that collectively drive a load. The plurality of amplifier stages have input nodes and output nodes, where output phase shift circuits connect the output nodes of the plurality of amplifier stages in a manner that causes output signals from the plurality of output nodes to add together for delivery to the load, wherein the plurality of output phase shift circuits have a plurality of phase shifts.

Further, a plurality of input phase shift circuits are coupled to the plurality of input nodes and provide input signals thereto, wherein the plurality of input phase shift circuits have also a plurality of phase shifts. In order to achieve the frequency selectivity of the selective differential amplifier, in U.S. Pat. No. 6,650,185, the phase shifts caused by the input phase shift circuits are not equal to the phase shifts caused by the output phase shift circuits, so that output signals from the plurality of amplifier stages are added with a frequency dependent phase relationship.

A further approach for removing a plurality of required, such as the RF bandpass filters 1, 2, 3, . . . , 7, 8 of device 100 of FIG. 1, is use of active filters, which are based on negative resistance concepts or recursive methods. However, the drawbacks are a quite high noise Figure, a limited tuning range, e.g. less than an octave, inter alia.

SUMMARY OF THE INVENTION

It is therefore an object of the present invention to provide a tunable filter device and a respective method enabling the tuning of a filter device in order to be able to remove a plurality of conventional filters such that those several special fixedly configured filters can be replaced by a single integrated circuit which provides a programmable frequency band response. Moreover, cost and overall size of such filter device should be equivalent to a single conventional filter device, but not several times.

In a first aspect of the present invention a tunable filter device is presented that comprises a distributed wide-band amplifier having at least two amplifying elements, an input transmission line connected to the input of the filter device and connecting inputs of the at least two amplifying elements, an output transmission line connected to the output of the filter device and connecting outputs of the at least two amplifying elements, and a frequency characteristics with a low cut-off frequency and a high cut-off frequency:

wherein the high cut-off frequency is defined by the cut-off frequency of the input and output transmission lines together with decoupling capacitors of the at least two amplifying elements, wherein the low cut-off frequency is defined by direct current blocking capacitors of the distributed wide-band amplifier, and wherein the value of the coupling capacitors and the direct current blocking capacitors are arranged to be changeable by respective external control signals.

In a further aspect of the present invention a method for tuning a frequency characteristics of a filter device is presented, wherein the filter device comprises a distributed wide-band amplifier having at least two amplifying elements, an input transmission line connected to the input of the filter device and connecting inputs of the at least two amplifying elements, an output transmission line connected to the output of the filter device and connecting outputs of the at least two amplifying elements, and the frequency characteristics having a low cut-off frequency and a high cut-off frequency, wherein the method comprises the steps:

defining the high cut-off frequency by the cut-off frequency of the input and output transmission lines together with decoupling capacitors of the at least two amplifying elements, defining the low cut-off frequency by the direct current blocking capacitors of the distributed wide-band amplifier, and tuning the frequency characteristics of the filter device by changing the value of the decoupling capacitors and the direct current blocking capacitors.

Preferred embodiments of the invention are defined in the dependent claims.

Hence, the basic principle of the invention is the use of a distributed, wide-band amplifier with a low-frequency cut-off and a high-frequency cut-off. The distributed amplifier is used in combination with a LCR network corresponding to the artificial transmission lines of the distributed amplifier and the connection elements to the power supply and to the ground potential of the whole circuit. The direct current (DC) blocking capacitors of the LCR network define the low-frequency cut-off, whilst the high-frequency cut-off is determined by the cut-off frequency of the artificial input and output transmission lines of the LCR network of the distributed amplifier.

In one embodiment the value of the direct current blocking capacitors is changeable by means of additional capacitors switchable arranged such that to be coupleable in parallel to the direct current blocking capacitors in accordance to the external control signal.

In a further development, the additional capacitors are arranged as a capacitor block, and the total capacitance value of the capacitor block is changeable by means of individual capacitors switchable connected in parallel by means of a respective switching elements. A switching element may be a semiconductor-switching element, such as a MOS transistor, or any other suitable semiconductor switch, e.g. a MEM-switch.

In a certain embodiment, the switching elements are configured to be controlled by means of a digital control signal, and the control signal is comprised of a digital control command of a predetermined number of bits such that the frequency characteristic of the tunable filter is digital programmable.

The switchable elements, the active amplifying elements of the distributed amplifier and driving means for the switching elements can be implemented in complementary metal oxide semiconductor technology. Preferably, the tunable filter device is implemented in a single chip. In a particular embodiment, the circuit network connecting the active elements of the distributed amplifier is preferably integrated in complementary metal oxide semiconductor technology, but is most suitably integrated in a passive integration connecting substrate technology (PICS).

As a result, the several filters used in conventional multi band devices can be removed and replaced by a single integrated circuit according to the invention, which provides a programmable frequency band response. The use of the distributed amplifier concept to achieve this is key because the performance of this amplifier type in terms of noise, gain, and linearity is independent of the cut-off frequencies. Therefore the gain and the noise Figure as well as the linearity will remain unchanged when tuning the cut-off frequencies.

A particular application of the presented tunable filter device is in a telecommunication device arranged for receiving multi frequency bands, in particular in a multi-band front end module with a receive path comprising the tunable filter device according to the invention. The switching of switching elements for changing the frequency characteristic of the filter device may be done at a low frequency in appropriate intervals so as not to disturb the high-frequency communication in the selected one of the multi frequency bands. In particular, the setting of the cut-off frequency values comprises respective driver circuits to drive the switches for switching the additional capacitors. This driver circuits may be integrated with the distributed amplifier, e.g. in CMOS technology or in a combination of CMOS and PICS. For instance, during the communication there is some time available to set-up the synthesizers, do some calibrations and thus, time frames of about 10 to 30 us may be used for setting the filter characteristics to the required frequency band.

In conventional RF front-end modules the linearity of the signal is concerned, in particular a filter-like amplifier introduces nonlinearity. The present invention uses a distributed amplifier, which provides a very good linearity performance, since the construction of the distributed amplifier can be considered as several transistors put in parallel. By use of the distributed amplifier concept, different frequency bandwidth can be achieved without modifying the gain, linearity, noise behavior and so on. In contrast thereto, any other type of amplifier would require each time the cut-off frequencies are tuned, to re-optimize (or re-tune) the matching elements, the bias conditions and the inter-stage circuits in order to recover or to keep the gain etc. as before.

BRIEF DESCRIPTION OF THE DRAWINGS

These and other aspects of the invention will be apparent from and elucidated with reference to the embodiment described hereinafter, whilst the features of the invention are set forth with particularity in the appended claims. The invention itself however, both as to organization and method of operation, together with objects and advantages thereof, may be best understood by reference to the following detailed description of the invention, which describes a certain exemplary embodiment of the invention, taken in conjunction with the accompanying drawings in which:

DETAILED DESCRIPTION OF EMBODIMENTS

Figure 3:
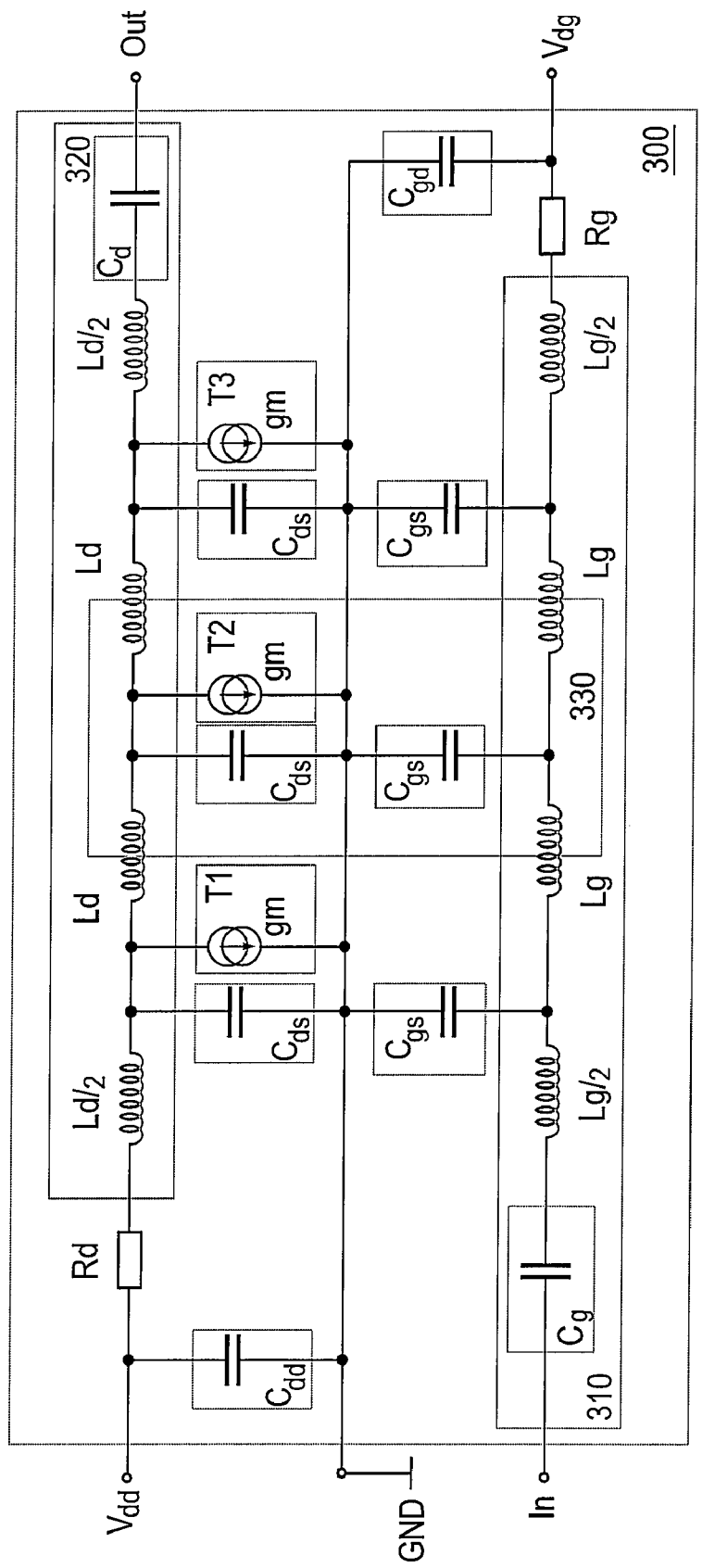
FIG. 3 shows one schematic embodiment of the filter device based on a distributed amplifier according to the invention.

FIG. 3 shows a schematic embodiment of a filter device 300 based on distributed amplifier technology according to the invention. Accordingly, the basic distributed amplifier is comprised of three amplifying active elements T1, T2, and T3, which simply may be semiconductor elements as transistors or itself highly integrated amplifying circuits. The active elements T1, T2, T3 are connected in parallel between two artificial transmission lines, namely an input transmission line 310 and an output transmission line 320. In this connection it is to be noted that the active elements are not present in the schematic of FIG. 3 for sake of better illustration, but the amplifying behavior of the active elements is represented by symbols representing controlled current sources with a transconductance gm and gain v.

The input transmission line 310 connects the input terminal In of the filter device 300 and the input terminals of the active elements via capacitors $C_{gs}$, which correspond to the respective gate-source capacity, if the active elements T1 to T3 are implemented as MOS transistors. The opposite end of the input transmission line 310 is connected via a terminating resistor $R_g$ to a supply voltage $V_{dg}$ and via a direct current (DC) blocking capacitor $C_{gd}$ to ground GND of the filter device 300. Further, there is DC blocking capacitor $C_g$ connected in series with the input terminal In of the device 300 and the input transmission line 310.

The output transmission line 320 connects the output terminal Out of the filter device 300 and the input terminals of the active elements via capacitors $C_{ds}$, which correspond to the respective drain-source capacity, if the active elements T1 to T3 are implemented as MOS transistors. The opposite end to the output terminal of the output transmission line 310 is connected via a terminating resistor $R_d$ to a supply voltage $V_{dd}$ and via a direct current (DC) blocking capacitor $C_{dd}$ to ground GND of the filter device 300. Further, there is DC blocking capacitor $C_d$ connected in series with the output terminal Out of the device 300 and the output transmission line 320.

Furthermore, the transmission lines 310, 320 are characterized by respective inductance parameters, which are represented in the schematic of the filter device 300 by inductors $L_d$, $L_g$, $L_d/2$ and $L_g/2$, respectively.

In FIG. 3, in order to illustrate the scalable concept of the device 300 one amplifying section together with a box 330 marks its respective parts of the LCR network.

Accordingly, the distributed amplifier 300 is set up by the parallel connected active elements T1, T2, T3, which are combined with a LCR network consisting of the, which basically is defining the frequency characteristics of the whole circuit with respect to signals supplied to the input terminal In of the device 300 and forwarded to the output terminal Out.

Accordingly, the power gain of the distributed amplifier (DA) can be determined by formula (2).

$$G = \frac{gm \cdot gm}{4} \cdot N \cdot N \cdot R_g \cdot 50, \qquad (2)$$

where gm is the transconductance of the employed amplifying elements, e.g. the used MOS transistor, N is the number of amplifying stages of the DA, and $R_g$ the termination resistor of the artificial input transmission line of the filter device 300.

The low cut-off frequency of the filter device 300 can be mainly determined by the direct current (DC) blocking or decoupling capacitors $C_g$, $C_d$, $C_{dd}$ and $C_{gd}$. The high cut-off frequency of the filter device 300 can be determined by the cut-off frequency of the artificial input and output transmission lines 310, 320 with formula (3) and formula (4).

$$f_g = \frac{1}{\pi \sqrt{L_g C_{gs}}} \qquad (3)$$

$$f_d = \frac{1}{\pi \sqrt{L_d C_{ds}}} \qquad (4)$$

In order to configure the distributed amplifier DA the constraint to be designed corresponds to solving the equation (5).

$$f_g = f_d \qquad (5)$$

Accordingly, $L_g C_{gs}$ is designed to be equal to $L_d C_{ds}$. Further, $R_g$ and $R_d$ may be made equal and in particular, to match the characteristic impedance of the two artificial input and output transmission lines 310, 320. For example, if the impedance of the transmission lines 310, 320 is designed to be about 50 Ohms, the filter device 300 can be matched to the quasi standard impedance value of the "outside world".

In accordance to the principle of the invention, by changing the values of the capacitors $C_g$, $C_d$, $C_{dd}$, $C_{gd}$, $C_{gs}$ and $C_{ds}$, for example, by adding extra or additional, respectively, capacitors in parallel to $C_g$, $C_d$, $C_{dd}$, $C_{gd}$, $C_{gs}$ and $C_{ds}$, the low and high cut-off frequencies of the filter device 300 can be configured and made to be tunable in operation as needed.

Figure 4:
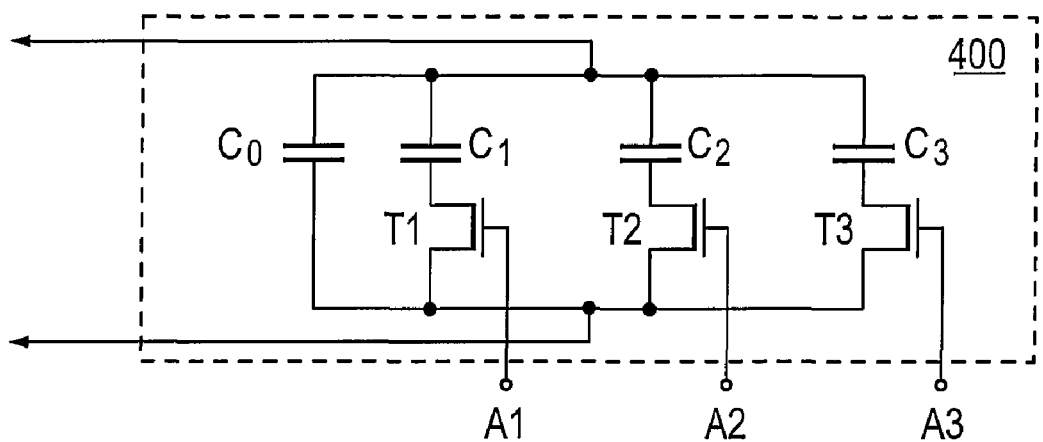
FIG. 4 shows one embodiment of a capacitor block for use with the filter device according to the invention, as shown in FIG. 3.

With respect to a certain embodiment of the invention, which is illustrated in FIG. 4, the value of the capacitors in question is arranged to be switchable by means of applicable switching elements, such as a semiconductor switch, e.g. a MOS-transistor. FIG. 4 depicts a possible implementation for changeable capacitors $C_g$, $C_d$, $C_{dd}$, $C_{gd}$, $C_{gs}$ and $C_{ds}$.

The basic idea is to have connected in parallel to the capacitors $C_g$, $C_d$, $C_{dd}$, $C_{gd}$, $C_{gs}$ and $C_{ds}$, a capacitor block 400. Accordingly, each individual capacitor, e.g. $C_g$, has a effective capacitance value which is comprised of the basic capacitance value of the capacitor in question, e.g. $C_g$, together with the set capacitance value of the parallel connected capacitor block 400, in which several additional capacitors $C_0$, $C_1$, $C_2$, $C_3$ are configured to be switchable.

In FIG. 4, the additional capacitors $C_1$, $C_2$, $C_3$ are each connected in series with a suitable switching element such that the respective additional capacitors $C_1$, $C_2$, $C_3$ can be switched between being effective and being not effective for the total capacitance value of the capacitor block 400. In other words, the total capacitance value of the capacitance block is determined by the sum of the individual capacitors $C_0$, $C_1$, $C_2$, $C_3$, being effective.

In FIG. 4, as a simple example the respective switching elements are realized by means of transistors T1, T2, T3, e.g. MOS transistors, connected in series to the respective capacitor $C_1$, $C_2$, $C_3$. It is noted, that the embodiment of FIG. 4 is such that the capacitor block 400 has a minimum capacitance value of $C_0$, due to the fact that the capacitor $C_0$ is designed not to be switchable.

The input terminals of each one of the switching transistors T1, T2, T3 corresponds to one control signal input terminal for setting or programming, respectively, the desired total capacitance value of the capacitor block 400. It goes without saying that the input terminals of the switching transistors T1, T2, T3 can be configured by means of a suitable driving circuit such that binary levels of a respective control signal logic can be used switch, i.e. to enable or disable, the respective switching transistors T1, T2, T3. Hence, the suitable control signal can be seen as corresponding to a digital control command of having a predetermined number of bits corresponding to the number of switching transistors T1, T2, T3.

Accordingly, by selecting, for instance, a corresponding bit combination A1, A2, A3, which is configured to control the switching MOS transistors T1, T2, T3, the total capacitance, which then fixes the bandwidth conditions, can be set. The capacitor block 400 of FIG. 4 is suitable to be applied to the all capacitors $C_g$, $C_d$, $C_{dd}$, $C_{gd}$, and to the input and output capacitors of the amplifying transistors $C_{gs}$ and $C_{ds}$.

In the following, a practical implementation of the concept disclosed herein will be discussed and illustrated. For instance, it is assumed that the following cut-off frequencies of three different pass bands have been realized: 50 MHz, 200 MHz and 500 MHz as low cut-off frequencies and 2 GHz, 3 GHz and 5 GHz as high cut-off frequencies, which can be used, i.e. tuned in, as respective cut-off frequencies of desired bandpass frequency bands of the filter device. In other words, with the assumed three low cut-off frequencies and three high cut-off frequencies, it will be possible to set or tune, respectively, the filter device to have 9 different pass bands, e.g. from 50 MHz to 2 GHz, from 50 Mhz to 3 GHz, from 50 MHz to 5 GHz, and the same with 200 MHz as well as 500 MHz and so on. It is worth noting that in the FIG. 6 for simplification only three of the possible pass bands are illustrated. The pass band has been designed to have a gain of 6 dB.

With existing CMOS technology, a transconductance gm of 20 mS for used active elements for the distributed amplifier is realistic, where 50 Ohms has been assumed as load impedance. Therefore, in accordance to formula (2) four stages, i.e. one stage 330 in the terms of the embodiment of FIG. 3, are needed.

The capacitor values have been chosen to maintain the equation (5) stated above valid. That is to say:

$$L_g \cdot C_{gs,global} = L_d \cdot C_{ds,global} \tag{6}$$

While keeping the characteristic impedances of the input and output transmission lines of the DA close to 50 Ohms. It is currently admitted that these characteristic impedances can vary from 25 to 75 Ohms around 50 Ohms, because from system point of view, a VSWR (Voltage Standing Wave Ratio) of less than 2 is often considered as realistic.

Accordingly, with respect to the input transmission line, it is assumed an inductance value for $L_g$ about 4 nH, such that the high cut-off frequencies can be determined as follows:

for 2 GHz, $C_{gs, global}$ becomes 6.34 pF, which gives a characteristic impedance of 25 Ohm, for 3 GHz, $C_{gs, global}$ becomes 2.82 pF, which gives characteristic impedance of 38 Ohm, and for 5 Ghz, $C_{gs, global}$ becomes 1.00 pF, which gives a characteristic impedance of 63 Ohm.

The control command register bits for the respective capacitor blocks (400 as shown in FIG. 4), i.e. A1 to A3 for switching the additional capacitors $C_0$, $C_1$, $C_2$, $C_3$, are to be set in order to choose the required values.

Having the output transmission line inductance $L_d$ equal to $L_g$, i.e. about 4 nH, the same capacitors $C_{ds, global}$ can be used. Accordingly, the high cut-off frequency control command register bits are the corresponding digital words comprised of the bits A1, A2, A3.

It goes without saying that the number of bit herein is merely for the purpose of illustration and in accordance to the required switchable capacitors in the used capacitor blocks or any equivalent implementation of a switchable capacitor, more bits may be used for the programmable capacitor value.

As described above, the low cut-off frequencies are set by means of the DC blocking or decoupling capacitor impedance with respect to $R_g$, $R_d$ and 50 Ohms. By having both $R_g$ and $R_d$ equal or close to 50 Ohms, and by choosing the DC decoupling impedance being 10 times lower than 50 Ohms at a given frequency f*, i.e., it has to be solved the following equation (7).

$$5 = \frac{1}{2\pi f^* \cdot C} \tag{7}$$

Hence, for a given frequency f* at 50 MHz, the decoupling capacitor $C_d$ can be determined as 635 pF, for f* at 200 MHz the decoupling capacitor $C_d$ becomes 150 pF, and for f* at 500 MHz, the decoupling capacitor $C_d$ becomes 63 pF. It goes without saying, that for implementation of a changeable capacitance value for $C_d$ the switchable capacitor block of FIG. 4 may again be used, wherein, of course, a respective low cut-off frequency band control command register may be another digital word, e.g. B1, B2, B3 or more bits.

In this connection it is worth noting that it has been found by the inventors, that the presented tunable filter allows for usual spread in values, e.g. caused by processing and temperature variations, of the specific values for impedances and capacitances discussed above. Moreover, the concept seems to be not too temperature sensitive. For instance, taken the specific values mentioned for simulation and as practical example, a variation of +−20% of the capacitance values will have an impact on the cut-off frequencies by +−9%.

As mentioned above, the herein presented tunable filter device may be highly integrated in a multi-band front end module for a cellular RF-transceiver or RF-receiver system by, for example, silicon (Si) based system-in-package (SiP) technology, where back-end processing is used to integrate the required passive components of the LCR-network of the distributed amplifier onto a Si-substrate that serves as a platform for heterogeneous integration with the active dies for the active elements of the distributed amplifier. The passive die can be made by application of so-called PICS (Passive Integration Connecting Substrate) technology that integrates passive components on one die, such as high-Q inductors (L), resistors (R), accurate MIM capacitors (C) and, in particular, high-density, e.g. 20 up to 100 nF/mm2 MOS "trench"-capacitors as the direct current blocking capacitors.

Figure 1:
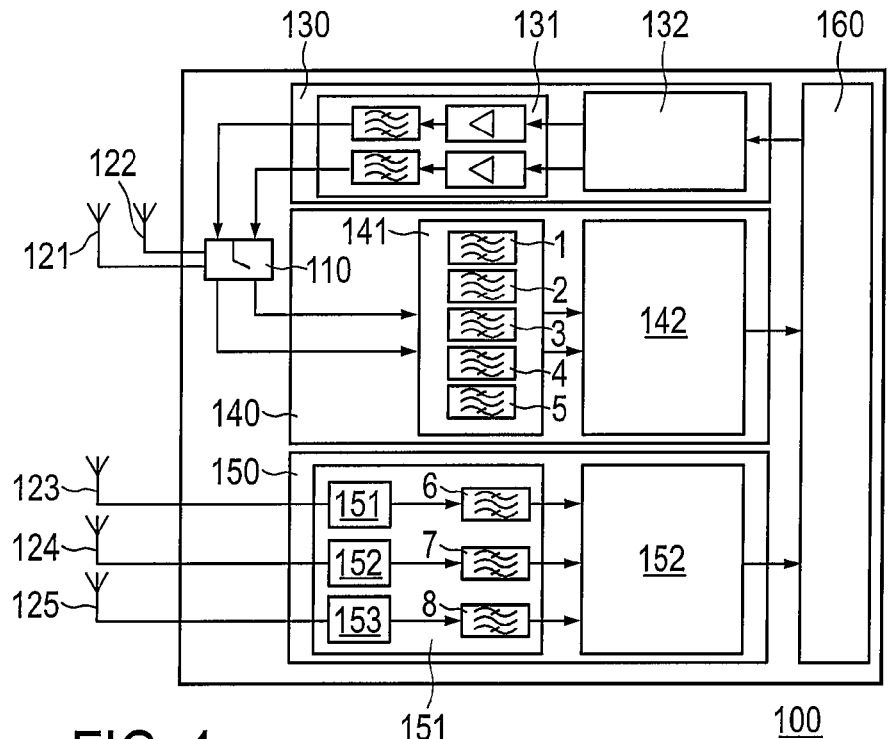
FIG. 1 shows an example of a conventional communication device front end with multi-band RF communication pipes.
Figure 2:
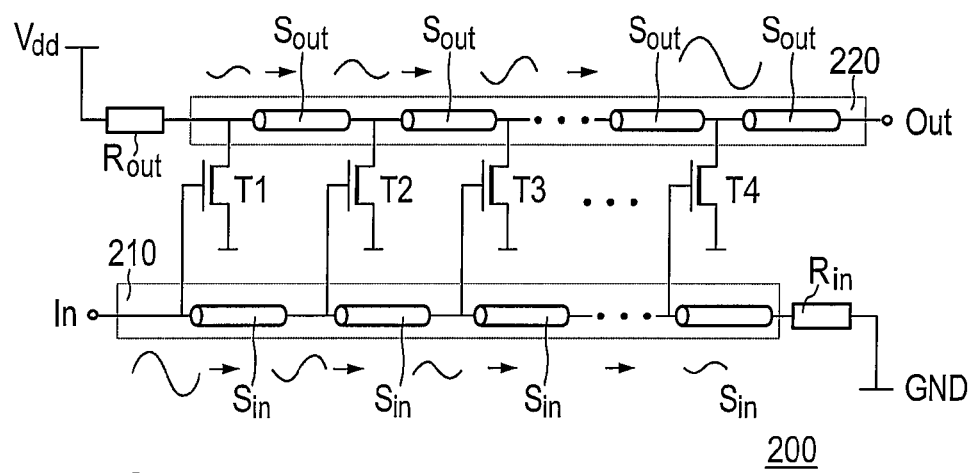
FIG. 2 illustrates the general principle of a distributed amplifier.
Figure 5:
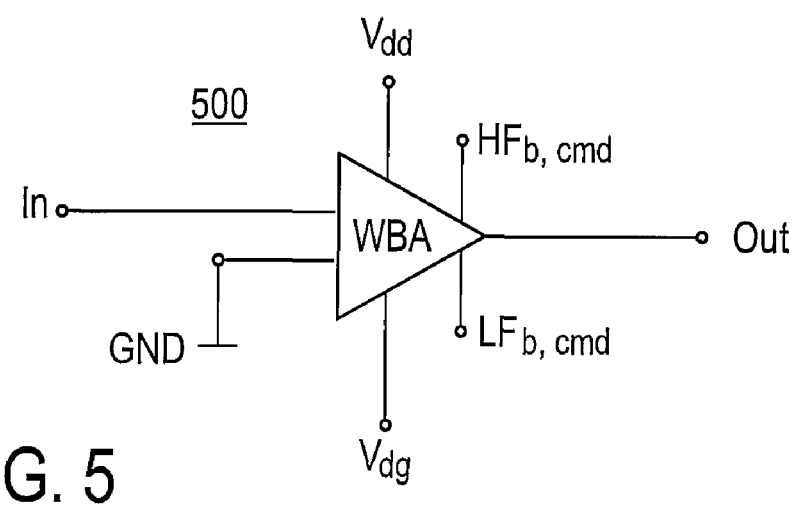
FIG. 5 depicts a filter device according to the invention as high integrated semiconductor component.

FIG. 5 illustrates the concept of a wide band amplifier according to the invention. Accordingly, a wide band amplifier 500 using distributed amplifier technology is highly integrated and comprises an input terminal In for a receiving signal, e.g. one of the receiving signals of the RF communication device 100 with multi-band RF communication pipes of FIG. 1. Further, the wide band amplifier 500 is connected to a power supplying voltage source $V_{dd}$ and also connected to a ground potential GND of the system. The filtered receiving signal is provided at an output terminal Out for further use, wherein via control signal inputs for a high cut-off frequency control command $HF_{b,\,cmd}$ and a low frequency cut-off control command $LF_{b,\,cmd}$ the required bandpass frequency characteristic is set or programmed, i.e. the filter device is tunable.

Figure 6:
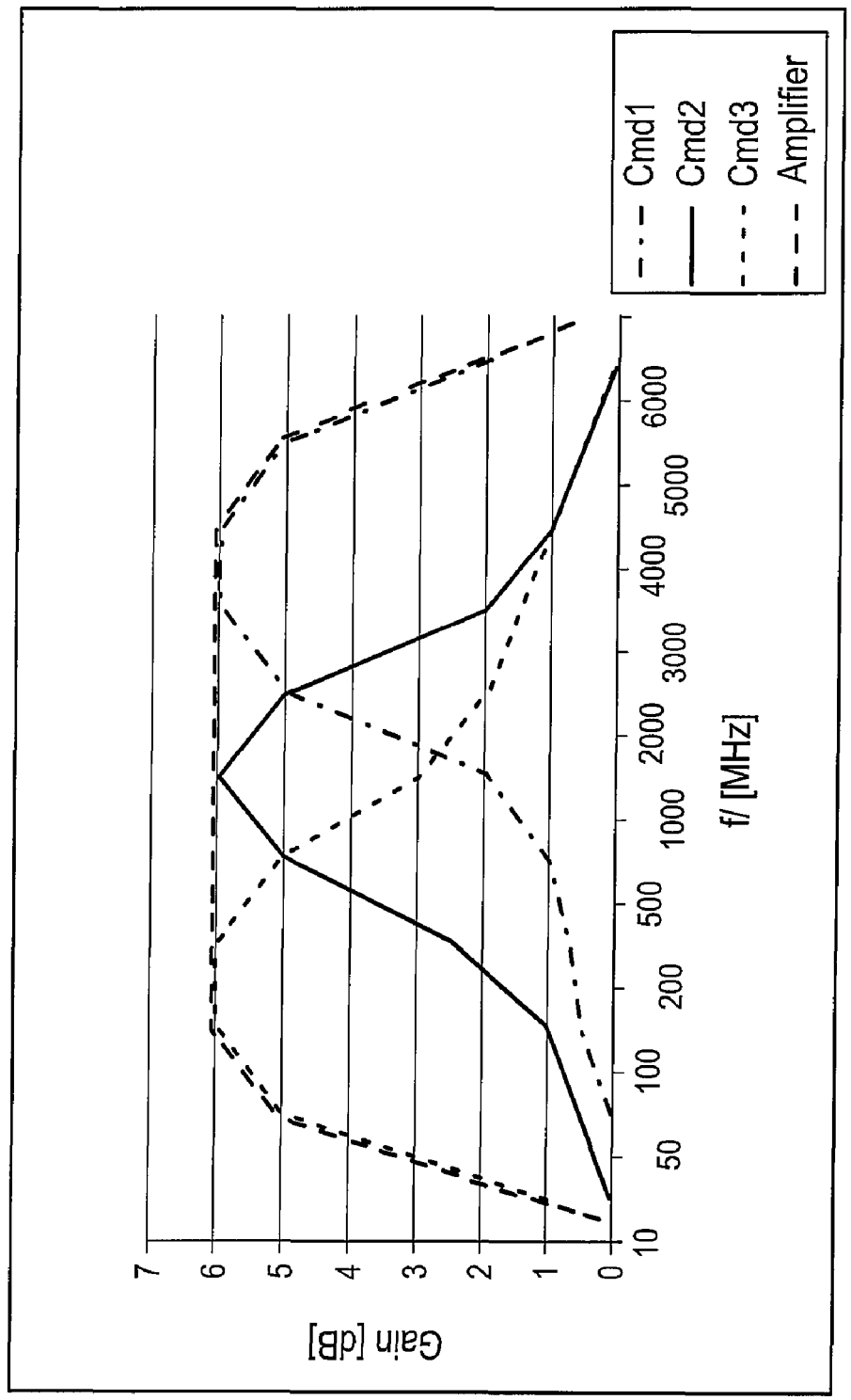
FIG. 6 illustrates an example of the total frequency responses of the distributed amplifier of FIG. 3.

An example for the total frequency responses is of the calculated embodiment above is depicted in FIG. 6, wherein the wide band amplifier frequency characteristic is demonstrated by the line "amplifier", and the three realized bandpass bands are shown as corresponding to corresponding control commands Cmd1, Cmd2, and Cmd3.

However, as mentioned hereinabove and as should be apparent from the principle of the invention, other frequency bandwidths can be achieved by using other combinations of the implemented cut-off frequencies.

In summary, the present invention discloses a tunable filter device for providing a tunable band pass characteristics for the receive path of a multi-band front-end module. Accordingly, it is proposed use of a distributed, wide-band amplifier with a low-frequency cut-off and a high-frequency cut-off in combination with a LCR network, of which wide-band amplifier the DC blocking capacitors are configured to define the low-frequency cut-off of the filter device, whilst the high-frequency cut-off is determined by the cut-off frequency of the artificial input and output transmission lines of the LCR network. In one certain embodiment, additional capacitors are coupled in parallel to the DC blocking capacitors of the LCR network, switchable by MOS transistors as switching elements, to make the capacitance value thereof adjustable. Accordingly, in a further certain embodiment it is proposed to allow tuning of the low- and the high-frequency cut-off by programming the capacitance value of the DC blocking capacitors with a digital control command.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

The invention claimed is:

1. A tunable filter device comprising:
a distributed wide-band amplifier having at least two amplifying elements, an input transmission line connected to the input of the filter device and connecting inputs of the at least two amplifying elements, an output transmission line connected to the output of the filter device and connecting outputs of the at least two amplifying elements, and a frequency characteristics with a low cut-off frequency and a high cut-off frequency,
wherein the high cut-off frequency is defined by the cut-off frequency of the input and output transmission lines together with decoupling capacitors of the at least two amplifying elements,
wherein the low cut-off frequency is defined by direct current blocking capacitors of the distributed wide-band amplifier,
wherein the value of the coupling capacitors and the direct current blocking capacitors are arranged to be changeable by respective external control signals, and
wherein value of the direct current blocking capacitors is changeable by means of additional capacitors switchably arranged to be coupleable in parallel to the DC blocking capacitors in accordance to the external control signal.

2. A tunable filter device according to claim 1, wherein the additional capacitors are arranged as a capacitor block, and wherein the total capacitance value of the capacitor block is changeable by means of individual capacitors switchably connected in parallel by means of respective switching elements.

3. A tunable filter device according to claim 2, wherein the switching element is a semiconductor-switching element.

4. A tunable filter device according to claim 2, wherein the switching elements are configured to be controlled by means of a digital control signal, and wherein the control signal is comprised of a predetermined number of bits such that the frequency characteristic of the tunable filter is digital programmable.

5. A tunable filter device according to claim 2, wherein the switching elements, the active amplifying elements and driving means for the switching elements are implemented in complementary metal oxide semiconductor technology.

6. A tunable filter device according to the preceding claim 5, wherein the tunable filter device is implemented in a single chip.

7. A tunable filter device according to claim 1, wherein the circuit network connecting the active elements of the distributed amplifier is integrated in complementary metal oxide semiconductor technology.

8. A method for tuning a frequency characteristics of a filter device comprising a distributed wide-band amplifier having at least two amplifying elements, an input transmission line connected to the input of the filter device and connecting inputs of the at least two amplifying elements, an output transmission line connected to the output of the filter device and connecting outputs of the at least two amplifying elements, and the frequency characteristics having a low cut-off frequency and a high cut-off frequency, wherein the method comprises the steps:

defining the high cut-off frequency by the cut-off frequency of the input and output transmission lines together with decoupling capacitors of at least two amplifying elements, defining the low cut-off frequency by direct current blocking capacitors of the distributed wide-band amplifier, wherein value of the direct current blocking capacitors is changeable by means of additional capacitors switchably arranged to be coupleable in parallel to the DC blocking capacitors in accordance to the external control signal, and tuning the frequency characteristics of the filter device by changing the value of the decoupling capacitors and the direct current blocking capacitors.

9. A telecommunication device arranged for receiving multi frequency bands comprising a multi-band front-end module with a receive path comprising a tunable filter device according claim 1.

10. A telecommunication device according to claim 9, wherein the switching of switching elements for changing the frequency characteristic of the filter device is configured to a switching frequency which corresponds to appropriate switching intervals such that interference with the high-frequency communication passing through the filter device is avoided.

* * * * *